(12) United States Patent
Hizawa et al.

(10) Patent No.: US 8,557,705 B2
(45) Date of Patent: Oct. 15, 2013

(54) METHOD OF MANUFACTURING SEMICONDUCTOR DEVICE AND APPARATUS FOR MANUFACTURING SEMICONDUCTOR DEVICE

(75) Inventors: Takeshi Hizawa, Mie (JP); Nobuhide Yamada, Mie (JP); Yoshihiro Ogawa, Mie (JP); Masahiro Kiyotoshi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 13/236,306

(22) Filed: Sep. 19, 2011

(65) Prior Publication Data

US 2012/0094493 A1    Apr. 19, 2012

(30) Foreign Application Priority Data

Oct. 14, 2010   (JP) ................... 2010-231502

(51) Int. Cl.
*H01L 21/311*   (2006.01)
(52) U.S. Cl.
USPC ............. 438/694; 134/99.1; 134/26; 134/33; 134/94.1; 134/95.1; 257/E21.224
(58) Field of Classification Search
USPC .............. 438/694; 257/E21.224; 134/33, 26, 134/137, 94.1, 95.2, 99.1
See application file for complete search history.

(56) References Cited

U.S. PATENT DOCUMENTS

| | | | |
|---|---|---|---|
| 6,645,881 B2 | 11/2003 | Yamada et al. | |
| 7,521,378 B2 * | 4/2009 | Fucsko et al. | 438/781 |
| 7,749,909 B2 | 7/2010 | Tomita et al. | |
| 2003/0139063 A1 | 7/2003 | Yamada et al. | |
| 2005/0106774 A1 * | 5/2005 | Simonian et al. | 438/51 |
| 2007/0295365 A1 | 12/2007 | Miya et al. | |
| 2011/0070680 A1 | 3/2011 | Takeishi et al. | |
| 2011/0143541 A1 | 6/2011 | Ogawa et al. | |

FOREIGN PATENT DOCUMENTS

| | | |
|---|---|---|
| JP | 2003-045843 | 2/2003 |
| KR | 10-2007-0091396 | 9/2007 |

OTHER PUBLICATIONS

Notification of Reason(s) for Refusal issued by the Korean Patent Office on Oct. 9, 2012, for Korean Patent Application No. 10-2011-86854, and English-language translation thereof.
Kiyotoshi, U.S. Appl. No. 13/049,456, filed Mar. 16, 2011.

* cited by examiner

*Primary Examiner* — Nadine G Norton
*Assistant Examiner* — Mahmoud Dahimene
(74) *Attorney, Agent, or Firm* — Finnegan, Henderson, Farabow, Garrett & Dunner, L.L.P.

(57) ABSTRACT

A method of manufacturing a semiconductor device in which an insulating film is filled between patterns etched into a workpiece structure is disclosed. The method includes cleaning etch residues residing between the etched patterns by a first chemical liquid; rinsing the workpiece structure cleaned by the first chemical liquid by a rinse liquid; and coating the workpiece structure rinsed by the rinse liquid with a coating liquid for formation of the insulating film. The cleaning to the coating are carried out within the same processing chamber such that a liquid constantly exists between the patterns of the workpiece structure.

17 Claims, 5 Drawing Sheets

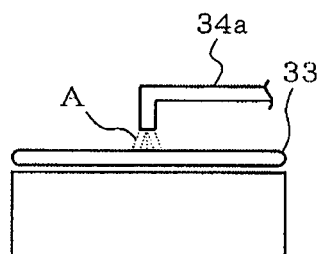
FIG. 1A
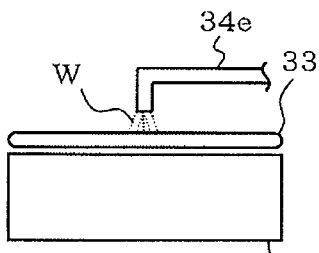
FIG. 1B
FIG. 1C
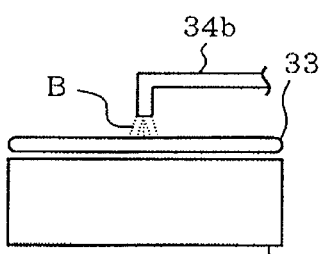
FIG. 1D
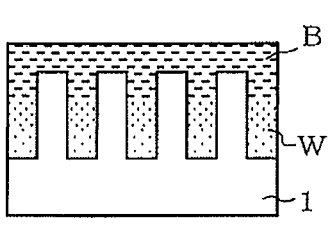
FIG. 1E
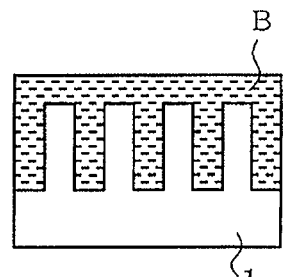
FIG. 1F
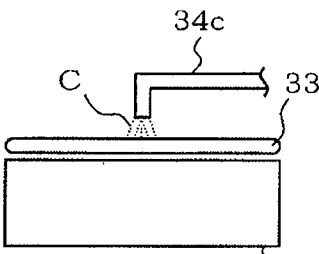
FIG. 1G
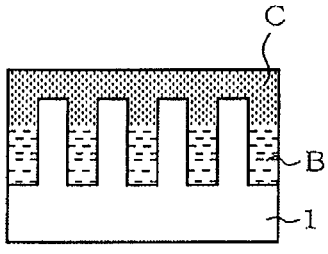
FIG. 1H
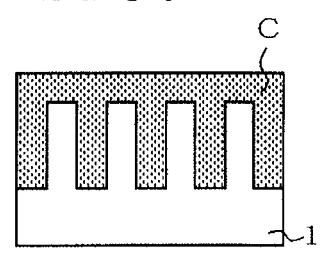
FIG. 1I
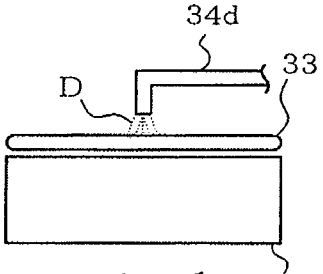
FIG. 1J
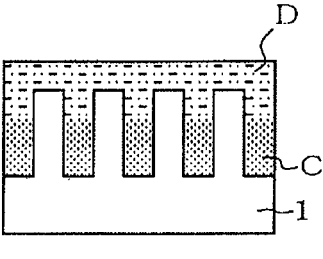
FIG. 1K
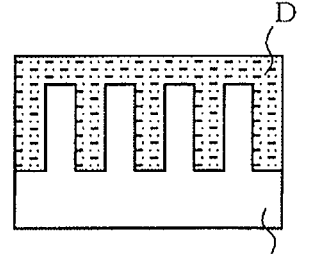
FIG. 1L

METHOD OF MANUFACTURING SEMICONDUCTOR DEVICE AND APPARATUS FOR MANUFACTURING SEMICONDUCTOR DEVICE

CROSS-REFERENCE TO RELATED APPLICATION(S)

This application is based upon and claims the benefit of priority from Japanese Patent Application No. 2010-231502, filed on, Oct. 14, 2010 the entire contents of which are incorporated herein by reference.

FIELD

Embodiments disclosed herein generally relate to a method of manufacturing semiconductor device and an apparatus for manufacturing a semiconductor device.

BACKGROUND

Semiconductor device manufacturing, which is a collection of integrated processes, involves many iterations of cleaning and drying steps between various processes. For instance, when a semiconductor substrate or a stack of films are etched into a line and space pattern of a given pitch, the spaces or gaps are thereafter typically filled with an insulating film. Before the gaps are filled with the insulating film, the wafer surface is cleaned to remove any impurities and residues.

In cleaning the wafer after etching, cleaning liquid is supplied onto the wafer surface, followed by a supply of purified water to rinse out the wafer. Then, the wafer is dried to remove the purified water from the wafer surface. A typical drying technique used today is IPA (Isopropyl alcohol) drying in which IPA substitutes purified water on the wafer surface.

However, microfabricated device features etched into high aspect ratios may risk collapses during the drying process by surface tension even when IPA is employed. Thus, there is a need in the industry to minimize the increasing risk of pattern collapse driven by pattern densification.

BRIEF DESCRIPTION OF THE DRAWINGS

FIGS. 1A to 1L each illustrates one phase of the manufacturing process flow according to one embodiment;

DETAILED DESCRIPTION

In one embodiment, a method of manufacturing a semiconductor device in which an insulating film is filled between patterns etched into a workpiece structure is disclosed. The method includes cleaning etch residues residing between the etched patterns by a first chemical liquid; rinsing the workpiece structure cleaned by the first chemical liquid by a rinse liquid; and coating the workpiece structure rinsed by the rinse liquid with a coating liquid for formation of the insulating film. The cleaning to the coating are carried out within the same processing chamber such that a liquid constantly exists between the patterns of the workpiece structure.

In one embodiment, an apparatus for manufacturing a semiconductor device is disclosed. The apparatus includes a placement that allows placement of a semiconductor substrate to be cleaned; a plurality of nozzles that supplies a plurality types of chemical liquid including a cleaning liquid to the semiconductor substrate being placed on the placement; a controller that controls the supply of the plurality types of chemical liquid to the semiconductor substrate through the nozzles such that a remnant of one type of the chemical liquid which was supplied through one of the nozzles and which resides above the semiconductor substrate is substituted by another type of the chemical liquid supplied through another nozzle; and a hot plate that vaporizes a solvent of the chemical liquid supplied to the semiconductor substrate.

One embodiment of the present disclosure will be described with reference to FIGS. 1 to 5B.

Embodiments are described hereinafter with references to the accompanying drawings to provide illustrations of the features of the embodiments. Elements that are identical or similar are represented by identical or similar reference symbols across the figures and are not redescribed. The drawings are not drawn to scale and thus, do not reflect the actual measurements of the features such as the correlation of thickness to planar dimensions and the relative thickness of different layers.

One embodiment of the present disclosure is described through formation of high aspect ratio features. More specifically, one embodiment of the present disclosure is described through filling of an insulating film between high aspect ratio patterns in a NAND flash memory device exemplified in FIGS. 4A and 4B and a ReRAM (Resistance RAM) device exemplified in FIGS. 5A and 5B. In one embodiment, a high aspect ratio feature is exemplified as a thin and tall pattern having an aspect ratio of 5 or more such as 8 and being thinner than 50 nm such as 30 nm.

Figure 4A:
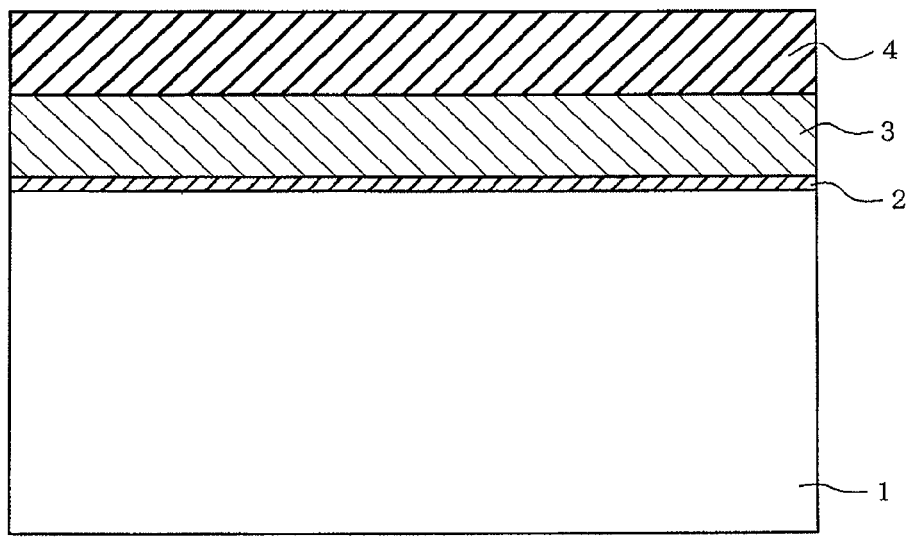
FIGS. 4A and 4B illustrate one phase of a manufacturing process flow of a NAND flash memory.
Figure 4B:
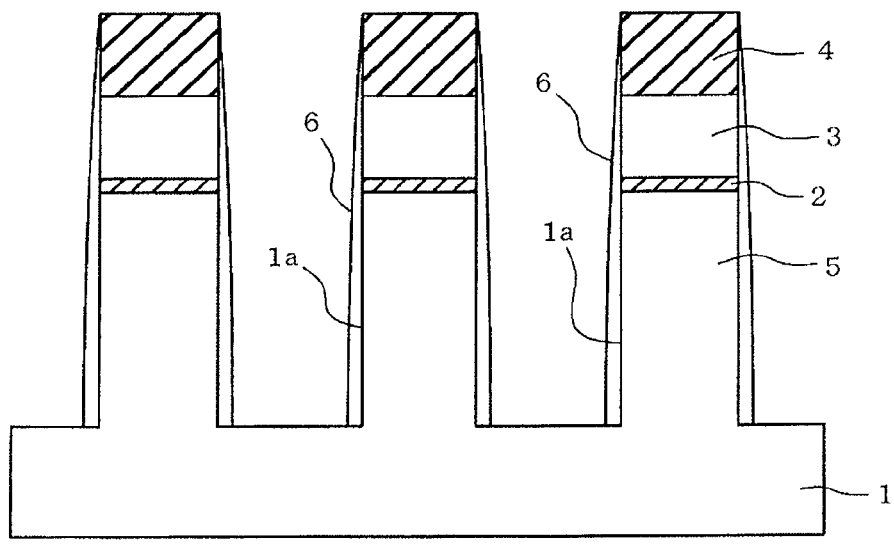

FIGS. 4A and 4B each illustrates one phase of a manufacturing process flow of a NAND flash memory. FIG. 4A illustrates a portion of a memory cell region which is later formed into a trench of an element isolation region as shown in the cross sectional view of FIG. 4B. Referring to FIG. 4A, above a semiconductor substrate exemplified as silicon substrate 1, gate insulating film 2 comprising a silicon oxide film, and polycrystalline silicon film 3 serving as a floating gate electrode are laminated in the listed sequence. Silicon nitride film 4, which is typically used in etching, etc. later in the process flow is further formed above polycrystalline silicon film 3.

Though not shown in FIG. 4B, a line and space resist pattern is formed above silicon nitride film 4 which is used as a mask for etching trench 1a into the laminate by RIE (Reactive Ion Etching). The etching progresses through silicon nitride film 4, polycrystalline silicon film 3, gate insulating film 2, and partially through silicon substrate 1 to obtain a line and space pattern of gate structures and trenches 1a. The surface layer of silicon substrate 1 is thus, delineated into isolated active areas 5. As can be seen in FIG. 4B, post-etch residue 6 is deposited on the sidewalls of trenches 1a.

Figure 5A:
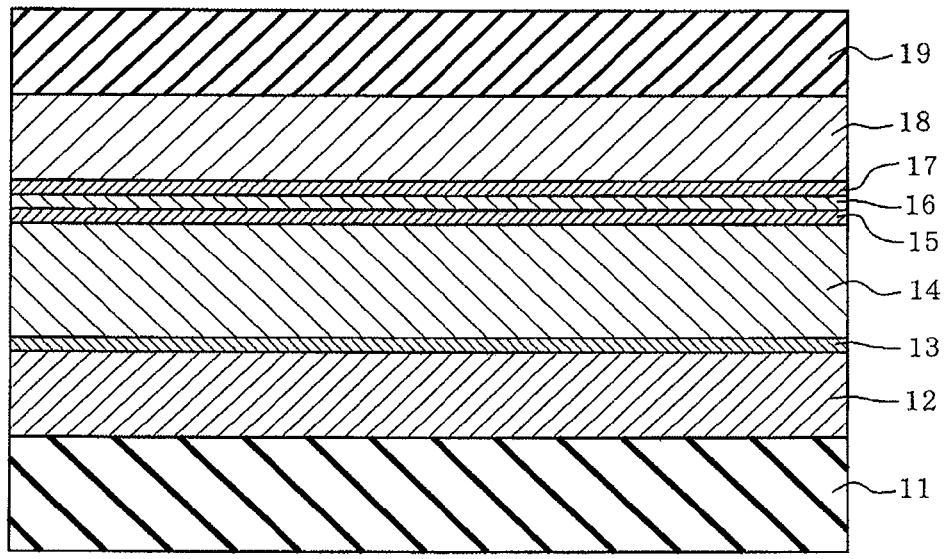
FIGS. 5A and 5B illustrate one phase of a manufacturing process flow of a ReRAM.
Figure 5B:
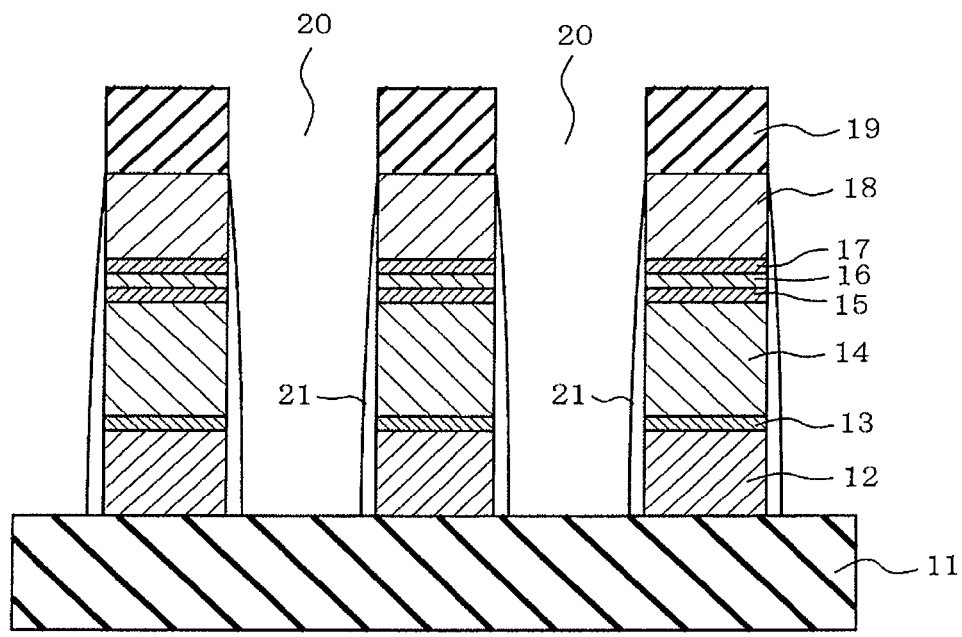

FIGS. 5A and 5B each illustrates one phase of a manufacturing process flow of a ReRAM which is one type of a three-dimensional memory. FIG. 5A illustrates a portion of a memory cell region which is later etched to simultaneously form the base structures for a memory element and a element selection diode as shown in the cross sectional view of FIG. 5B. Referring to FIG. 5A, above a semiconductor substrate, insulating film 11, tungsten (W) film 12 serving as a word line, titanium nitride (TiN) film 13, and polycrystalline silicon layer 14 taking a diode structure are laminated in the listed sequence. Further above polycrystalline silicon layer 14, lower electrode film 15, ReRAM element film 16, and upper electrode film 17 are laminated in the listed sequence. Tungsten (W) film 18 and hard mask 19 are further laminated in the listed sequence above upper electrode film 17.

Referring now to FIG. 5B, using hard mask film 19 as a mask, the laminate is etched all the way through tungsten film 12 by RIE until insulating film 11 is exposed to form element portions isolated by isolation regions 20 defined by the etching. As can be seen in FIG. 5B, residue 21 remains on the sidewalls of element portions facing element isolation regions 20.

In one embodiment, a manufacturing process flow is described which includes a cleaning step in which etching residue 6 or 21 shown in FIGS. 4B or FIG. 5B is removed, followed by a coating step in which coating type silicon oxide film is filled into trench 1a or element isolation region 20. The above described process flow, being free of a drying step, advantageously prevents pattern collapses which is typically observed when forming high aspect ratio features.

Figure 2:
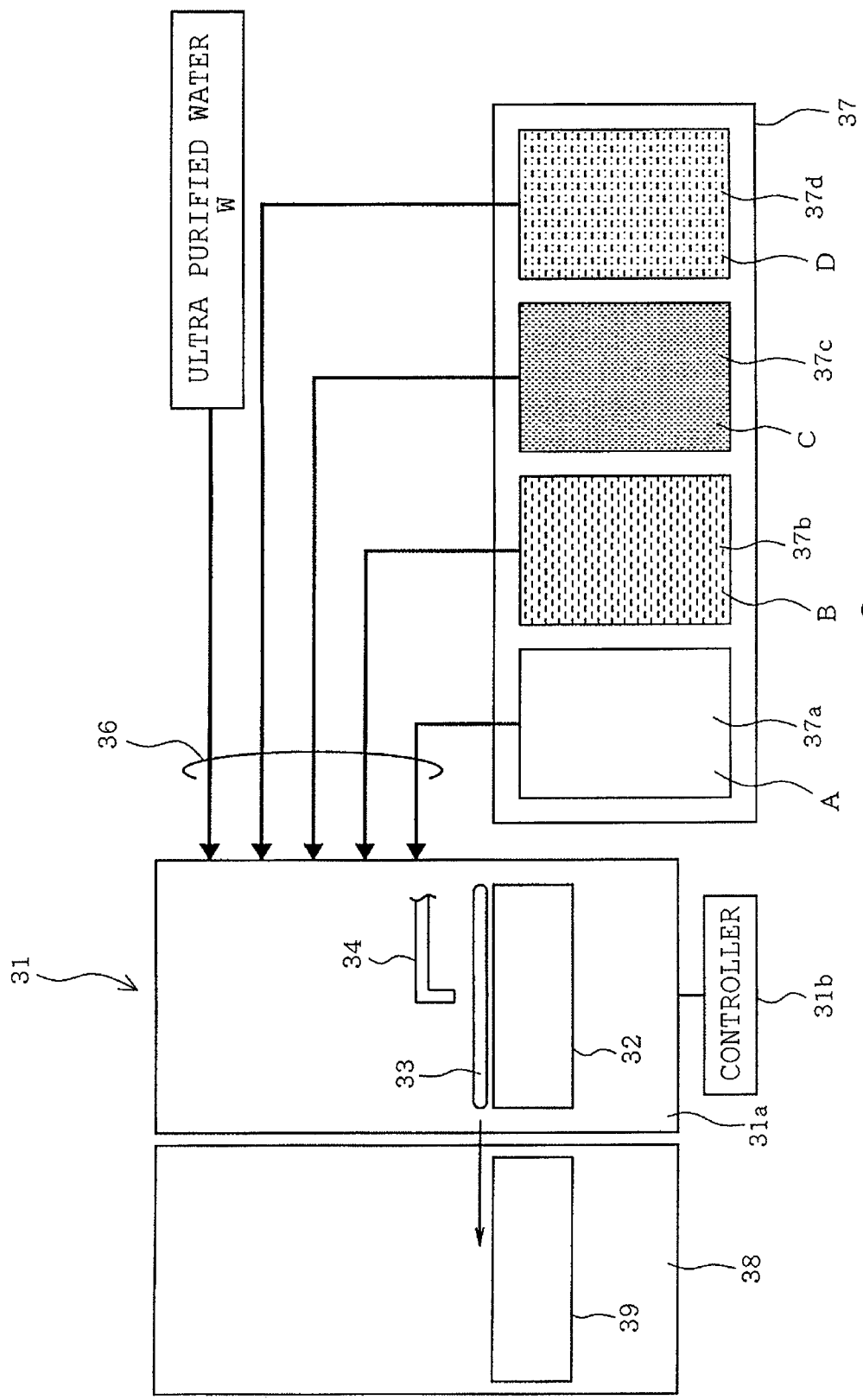
FIG. 2 is a schematic diagram of a cleaning apparatus.
Figure 3:
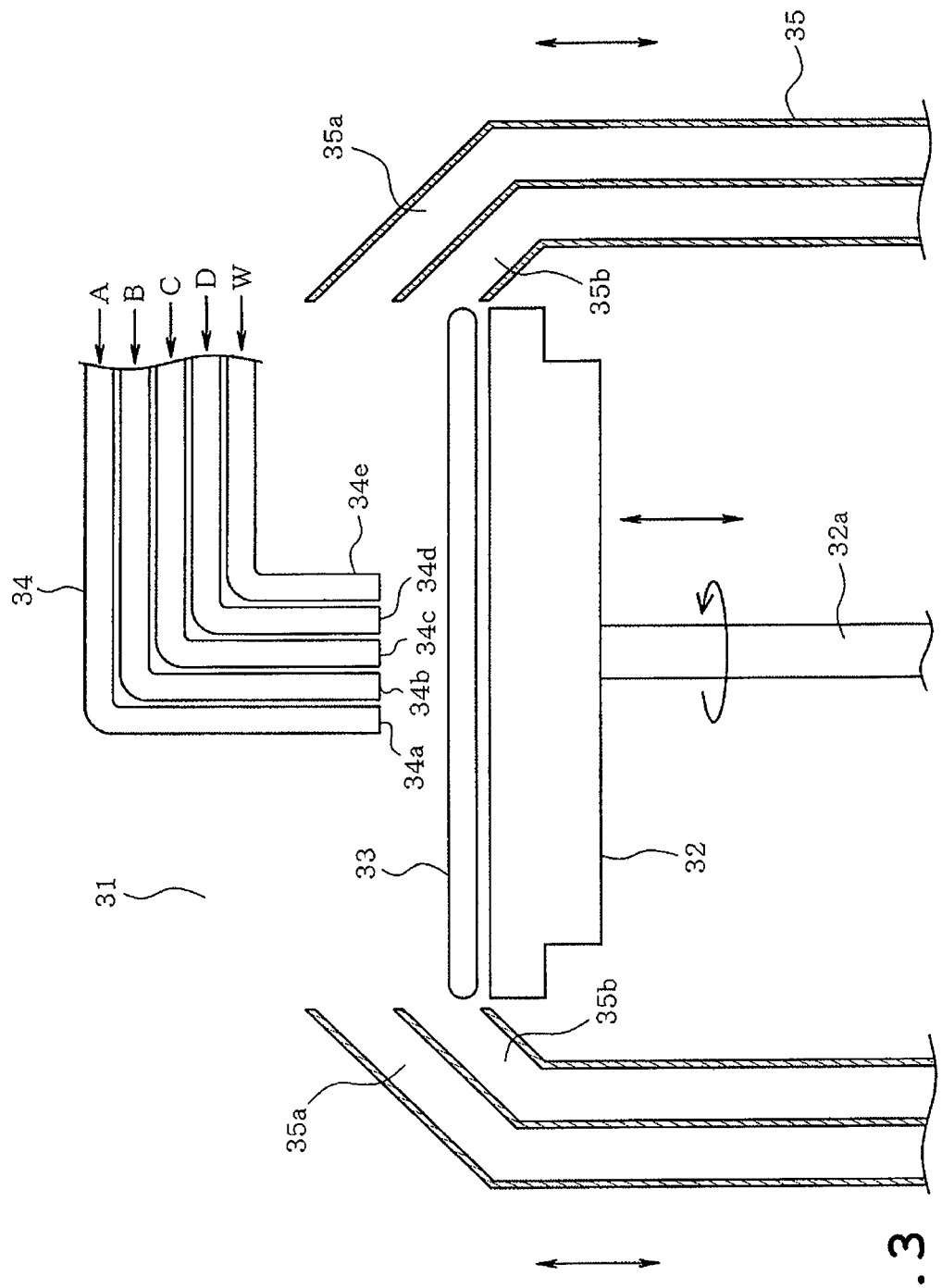
FIG. 3 is a schematic diagram of a nozzle system and a waste collection structure.

Referring to FIGS. 2 and 3, a description will be given on the configuration of an apparatus used in the cleaning process. Cleaning apparatus 31 employs a single wafer processing system provided with wafer stage 32 which is rotated within processing chamber 31a. Wafer 33 is placed on wafer stage 32 and cleaned while supplying chemical liquid. The cleaning process carried out by cleaning apparatus 31 is controlled by controller 31b. As can be seen in FIG. 3, wafer stage 32 is secured to rotary shaft 32a which is coupled to a drive motor and is driven in rotation in the horizontal direction at a controlled speed.

Above wafer stage 32, a nozzle system 34 comprising a plurality of nozzles 34a to 39e is disposed for discharging chemical liquid onto wafer 33. Around the outer periphery of wafer stage 32, waste cup 35 comprising waste collectors 35a and 35b is provided so as to be movable up and down. The chemical liquid supplied onto wafer 33 from nozzle system 39 is spun off into waste cup 35 located around the peripheral edge of wafer 33 by the rotation of wafer 33. Waste cup 35, comprising a double layer of waste collector 35a and waste collector 35b, is configured allows waste or drainage of different types such as an inorganic waste and organic waste to be collected separately. Waste cup 35 being movable up and down is elevated or lowered so as to place either waste collector 35a or waste collector 35b at level with wafer stage 32 depending upon the type of waste being collected.

Nozzles 39a to 34d of nozzle system 34 is connected to chemical liquid cabinet 37 through piping 36. Nozzle 34e is connected to the source of ultra purified water W through piping 36 while the remaining nozzles 34a to 34d are connected to chemical liquid reservoirs 37a to 37d which are sources of the chemical liquids that they supply. Chemical liquid reservoirs 37a to 37d each contain first to third chemical liquids and coating liquid, respectively.

The following are examples of cleaning chemicals and coating liquid. The first chemical liquid A may be hydrofluoric acid such as dilute hydrofluoric acid (DHF) for removing post-etch residues. The second chemical liquid B may be isopropyl alcohol (IPA) which is an organic and alcoholic cleaning liquid. The third chemical liquid C may be a dibutylether which is an organic and ethereous cleaning liquid. Coating liquid D may be polysilazane (PSZ) for forming coating type silicon oxide film.

Provided adjacent to cleaning apparatus 31 is baking chamber 38 containing hot plate 39 serving as a heating element. Wafer 33 coated with polysilazane coating liquid D is transferred into baking chamber 38 to be placed on hot plate 39 and heated to evaporate the solvent of polysilazane coating liquid D.

Next, the process flow of cleaning to coating steps carried out using cleaning apparatus 31 will be described with reference to FIGS. 1A to 1L. In the following description, relative RC values are used as an index for evaluating the characteristics of the second, third chemical liquids, water, and the coating liquid. Relative RC value is defined by $N_{OH}/N_{CH}$, where $N_{OH}$ represents the number of OH groups within a single molecule of a liquid and $N_{CH}$ represents the number of CHx groups (x is an integer ranging between 1 to 3) within a single molecule of a liquid. The relative RC values of the liquids are as set forth below.

| Liquid | Example | Relative RC |
| --- | --- | --- |
| Water | ultra purified water | RCw |
| 2nd liquid | isopropylalcohol B | RC2 |
| 3rd liquid | dibutylether C | RC3 |
| Coating liquid | polysilazane coating liquid* | RCX |

*contains dibutylether as a solvent

The following relation stands between the relative RC values presented above.

$$RCw > RC2 > RC3 \geq RCX \quad (1)$$

$H_2O$ molecule possesses an OH group but does not possess a CH group and thus, RCw amounts to infinity. Accordingly, RCw is greater than RC2 of isopropylalcohol B which possesses both OH and CH groups. Because the molecule of dibutylether C does not possess an OH group, RC3 amounts to zero. Likewise, the solvent of polysilazane coating liquid is dibutylether which does not possess an OH group and thus, RCX also amounts to zero. Hence, the above relation (1) stands.

Description will now be given on the process flow of the cleaning step and the subsequent coating step.

Wafer 33 in which multiplicity of semiconductor devices are formed is typically subjected to RIE in the dry etching step to form high aspect ratio line and space patterns (L/S patterns). As can be seen in FIGS. 4B, and 5B, RIE typically leaves residues 6 or 21 on the sidewalls of trenches 1a shown in FIG. 4B or on the sidewalls of isolation regions 20 shown in FIG. 5B.

The etched wafer 33 placed on wafer stage 32 of cleaning apparatus 31 is subjected to a series of consecutive cleaning steps. As a preparatory step, waste cup 35 is transferred to a height such that waste collector 35a is level with wafer stage 32 to collect inorganic waste liquid spun off of wafer 33.

In step 1 shown in FIG. 1A, hydrofluoric acid A is supplied through nozzle 34a onto wafer 33 placed on wafer stage 32 which is rotated at a certain speed such that the entire wafer 33 is covered with hydrofluoric acid A. Wafer 33 is rotated at a relatively slow speed such that not all the supplied hydrofluoric acid A is spun off of wafer 33 but a certain amount remains (and exists) on wafer 33. Residues 6 or 21 remaining on wafer 33 is thus, removed in step 1. Hydrofluoric acid A spun off of wafer 33 is collected by waste collector 35a of waste cup 35 located around the outer periphery of wafer 33.

Then, in step 2 shown in FIG. 1B, ultra purified water W serving as a rinse liquid is supplied onto wafer 33 through nozzle 34e with hydrofluoric acid A covered over wafer 33 or at least filling up trench 1a or isolation region 20. Ultra purified water W rinses wafer 33 while substituting hydrofluoric acid A remaining on wafer 33 to place wafer 33 in the state shown in FIG. 1C. Ultra purified water W spun off of wafer 33 is collected by waste collector 35a of waste cup 35 located around the outer periphery of wafer 33 as was the case in step 1. Step 2 is also terminated with ultra purified water W remaining on wafer 33 with trench 1a or isolation region 20 filled with ultra purified water W.

Next, in step 3 shown in FIG. 1D, second chemical liquid, in this case, isopropylalcohol B is supplied onto wafer 33 through nozzle 34b, with ultra purified water W remaining on wafer 33, to substitute ultra purified water W with isopropylalcohol B. Generally, isopropylalcohol B is hydrophilic and thus, mixes well with water as shown in FIG. 1E. Moreover, as concentration of isopropylalcohol B within the mixture increases with supply of isopropylalcohol B, ultra purified water W is promptly substituted by isopropylalcohol B to obtain the state shown in FIG. 1F. Isopropylalcohol B spun off of wafer 33 is collected by waste collector 35a of waste cup 35 located around the outer periphery of wafer 33. Step 3 is also terminated with isopropylalcohol B remaining on wafer 33 with trench 1a or isolation region 20 filled with isopropylalcohol B. In step 3, isopropylalcohol B is collected through waste collector 35a, however, greater priority is placed on collecting ultra purified water W' left within trench 1a or isolation region 20 of wafer 33 at the end of step 2 through waste collector 35a which is responsible for collecting inorganic liquid. Because ultra purified water W is not collected through waste collector 35b, organic waste liquid collected later in the process flow will not mix with waste liquid of ultra purified water W.

As a preparatory step to step 4 shown in FIG. 1G, waste cup 35 is transferred such that waste collector 35b is level with wafer stage 32 in order to collect organic waste liquid. Then, third chemical liquid, in this case, dibutylether C is supplied onto wafer 33 through nozzle 34c, with isopropylalcohol B remaining on wafer 33, to substitute isopropylalcohol B with dibutylether C. Thus, substitution of isopropylalcohol B with dibutylether C causes the transition from the mixed state shown in FIG. 1H to the substituted state shown in FIG. 1I. Waste liquid of step 4, that is, the substituted isopropylalcohol B and dibutylether C spun off of wafer 33 are collected by waste collector 35b of waste cup 35 located around the outer periphery of wafer 33. Isopropylalcohol B is affinitive with dibutylether C and thus, mixes well together and is promptly substituted by dibutylether C. As mentioned earlier, relative RC3 of dibutylether C is less than relative RC2 of isopropylalcohol B.

Finally, in step 5 shown in FIG. 1J, polysilazane coating liquid D serving as a coating liquid is discharged onto wafer 33 through nozzle 34d, with dibutylether C remaining on wafer 33. Polysilazane coating liquid D contains perhydropolysilazane as a solute and dibutylether as a solvent and thus, is highly compatible with dibutylether C on wafer 33 as shown in FIG. 1K. Dibutylether C is promptly substituted by polysilazane coating liquid D to allow wafer 33 to be coated with polysilazane coating liquid D as shown in FIG. 1L. Waste liquid of step 5, that is, the substituted dibutylether C and polysilazane coating liquid D spun off of wafer 33 are collected by waste collector 35b of waste cup 35 located around the outer periphery of wafer 33. As mentioned earlier, relative RC3 of dibutylether C and relative RCX of polysilazane coating liquid D of solvent are equal because their $N_{OH}$ are zero, i.e. RC3=RCX.

As mentioned earlier, once coating of wafer 33 with polysilazane coating liquid D is completed, wafer 33 is transferred to baking chamber 38 to be placed on hot plate 39. Then, wafer 33 placed on hot plate 39 is baked by heat transfer at a certain temperature to vaporize dibutylether which is the solvent of polysilazane coating liquid D. Then, as wafer 33 is subjected to water vapor oxidation, N-bond is substituted by O-bond to form a silicon oxide film serving as an element isolation insulating film within trench 1a shown in FIG. 4B or to form a silicon oxide film serving as an interlayer insulating film in element isolation region 20 of the element portion shown in FG.5B.

As described above, the pattern formation progresses after etching from step 1 in which wafer 33 is cleaned by hydrofluoric acid A to the coating of wafer 33 with polysilazane coating liquid D in step 5 by keeping the upper surface of wafer 33 within chamber 31a wet without drying. That is, because trenches 1a or isolation regions 20 formulating the patterns of wafer 33 are constantly immersed with chemical liquids which are substituted by another as the process flow progresses, patterns formed on wafer 33 is prevented from collapsing by stress induced by surface tension. Patterns that are 50 nm or thinner, and especially 30 nm or thinner and that have aspect ratio of 5 or more, and especially 8 or more are collapse prone. However, the process flow described above effectively reduces the occurrence of pattern collapses.

Further, because the series of steps from cleaning to coating can be carried out consecutively within the same chamber 31a with wafer 33 being constantly wetted without having to execute any drying steps, the entire process flow can be reduced in number of steps.

While allowing inorganic chemical liquid such as hydrofluoric acid A and organic chemical liquid such as isopropylalcohol B, dibutylether C, and polysilazane coating liquid D to be used within the same cleaning apparatus, their waste liquids are collected separately through waste cup 35 comprising waste collectors 35a and 35b to prevent undesirable reactions. For instance, as exemplified in the above described embodiment, when using polysilazane coating liquid D which contains perhydropolysilazane as a solute and dibutylether as a solvent, separate collection of waste liquid of polysilazane coating liquid D and the waste liquid containing water prevents undesirable reactions that produce hydrogen or silane gas.

Isopropylalcohol B used in the above described embodiment is not used for drying purposes as was the case in conventional applications but for improving the compatibility with dibutylether C which is subsequently supplied to wafer 33 and to facilitate the substitution of the liquids. More specifically, because each of the liquids are supplied in the descending order of their size of relative RC values as defined in formula (1), substitution of the liquids can be facilitated as compared to directly substituting ultra purified water W with dibutylether C because the difference between the relative RC value of isopropylalcohol B and dibutylether C is smaller than the difference between the relative RC value of ultra purified water W and dibutylether C, meaning that isopropylalcohol B and dibutylether C exhibit better compatibility on wafer 33 and thus, facilitates liquid substitution.

The features exemplified in FIGS. 9A to 5B which are subjected to the above described steps are patterned such that structures such as silicon substrate 1 and polycrystalline silicon film 14 are exposed. It is thus, desirable to process the exposed portions as follows to relax the negative impacts on device properties and for quality improvement.

In step 1, before proceeding to step 2 after removing etch residues 6 or 21 with hydrofluoric acid A, wafer 33 may be subjected to cleaning with acidic or alkaline aqueous solution containing ozone ($O_3$) or hydrogen peroxide ($H_2O_2$). This is aimed to oxidize the surface of silicon by cleaning the exposed silicon with acidic or alkaline aqueous solution. In this case also, wafer 33 stays wet by the cleaning liquid containing aqueous solution of ozone water or hydrogen peroxide without having to be dried before proceeding to step 2, where wafer 33 is rinsed with ultra purified water W.

The above described oxidation relaxes the occurrence of fixed charge and negative impact of interface energy attributable to element isolation insulating film or interlayer insulating film. Because the wet wafer 33 can be oxidized without having to dry it, the above described oxidation scheme effectively replaces HTO (High Temperature Oxide) process which requires a dry wafer 33 and yet provide the same level of quality as HTO process.

Isopropylalcohol B serving as the second chemical liquid and dibutylether C serving as the third chemical liquid may be replaced by other chemical liquids, which have close specific gravity, to facilitate mixing of the liquids. Employing a chemical liquid having a heavier specific gravity than the second chemical liquid as the third chemical liquid facilitates the substitution of third chemical liquid with second chemical liquid. Further, ultra purified water W may contain carbon dioxide ($CO_2$) gas to improve electric conductivity and thereby restrain wafer charging.

A solvent containing more than one chemical liquid may be employed as second or the third chemical liquid such as FIFE (Hydrofluoroether). In such case, OH concentration and CHx concentration may be calculated based on the relative percentage of the chemical liquids within the mixture or may simply employ OH concentration and CH concentration of the chemical liquid that occupies the largest percentage within the mixture. The percentage of each chemical liquid within the mixture is usually represented by weight % but may be represented by volume % as well.

In step 4, dibutylether C was supplied as the third chemical liquid and was substituted with isopropylalcohol B. However, if ultra purified water W is sufficiently substituted with isopropylalcohol B in step 3, step 4 may be omitted. Further, step 4 may also be omitted if OH group possessed by isopropylalcohol B has no substantial effect on polysilazane.

Polysilazane coating liquid D may be replaced by a chemical liquid containing a solute containing one or combination of silicon compounds such as hydrogen silsesquioxane (HSQ), methylsilsesquioxane (MSQ), and methylsiloxane (MSX) and a solvent containing one or combination of propylene glycol methyl ether acetate (PGMEA) and propylene glycol monomethyl ether (PGPE). The above described coating films are known as SOG (Spin On Glass) and are treated in a similar manner in filling trench 1a of silicon substrate 1 or element isolation region 20 of the element portion with an insulating film. The only requirement in using these coating films is that relative RCX value satisfies the relation represented by formula (1).

Further, depending upon the type of SOG given above, the SOG may be coated over wafer 33 in which ultra purified water W substituting hydrofluoric acid A in step 2 is the remnant on wafer 33. In such case, the process may proceed directly from step 2 to step 5 with ultra purified water W remaining on wafer 33.

Waste cup 35 comprises waste collector 35a primarily configured to collect inorganic waste liquid and waste collector 35b primarily configured to collect organic waste liquid. However, waste cup 35 may be configured by three waste collectors. For instance, the first waste collector may be used to collect inorganic waste in steps l and 2, the second waste collector may be used to collect ultra purified water W and isopropylalcohol B in step 3, and the third waste collector may be configured to collect organic waste in step 4 and step 5. Still further, four or more waste collectors may be provided to allow each step to discharge waste through a dedicated waste collector.

Instead of moving waste cup 35 up and down, wafer stage 32 may be moved up and down to adjust the heights of waste collectors 35a and 35b with wafer stage 32. Further, both waste collectors 35a and 35b and wafer stage 32 may be configured to be movable up and down such that the relative positioning of wafer stage 32 and waste collectors 35a and 35b is controlled between a first state in which wafer stage 32 and waste collector 35a is level and a second state in which wafer stage 32 and waste collector 35b is level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device in which an insulating film is filled between patterns etched into a workpiece structure, comprising:
    cleaning etch residues residing between the etched patterns by a first chemical liquid;
    rinsing the workpiece structure cleaned by the first chemical liquid by a rinse liquid; and
    coating the workpiece structure rinsed by the rinse liquid with a coating liquid for formation of the insulating film;
    wherein the cleaning of the etch residues to the coating of the workpiece structure are carried out within the same processing chamber such that a liquid constantly exists between the patterns of the workpiece structure.

2. The method according to claim 1, further comprising supplying a second chemical liquid to the workpiece structure, after the rinsing and before the coating, and substituting the rinse liquid remaining between the patterns of the workpiece structure with the second chemical liquid.

3. The method according to claim 1, wherein the first chemical liquid comprises a dilute hydrofluoric acid.

4. The method according to claim 1, wherein the rinse liquid comprises a purified water.

5. The method according to claim 2, wherein the second chemical liquid comprises an isopropylalcohol.

6. The method according to claim 5, wherein the coating liquid comprises a polysilazane solution.

7. The method according to claim 6, wherein the polysilazane solution comprises a solvent including a third chemical liquid.

8. The method according to claim 7, further comprising supplying the third chemical liquid to the workpiece structure, after substituting the rinse liquid with the second chemical liquid and before the coating, and substituting the second chemical liquid remaining between the patterns of the workpiece structure with the third chemical liquid.

9. The method according to claim 8, wherein the third chemical liquid comprises a dibutylether.

10. The method according to claim 1, further comprising supplying a solution including ozone or hydrogen peroxide, after the cleaning and before the rinsing, to oxidize a surface of the workpiece structure.

11. A method of manufacturing a semiconductor device in which an insulating film is filled between patterns etched into a workpiece structure, comprising:
- cleaning etch residues residing between the etched patterns by a first chemical liquid;
- rinsing the workpiece structure cleaned by the first chemical liquid by a rinse liquid;
- supplying a second chemical liquid to the workpiece structure after the rinsing and substituting the rinse liquid remaining between the patterns with the second chemical liquid; and
- coating the workpiece structure with a coating liquid for formation of the insulating film after substituting the rinse liquid remaining between the patterns with the second chemical liquid;
- wherein the cleaning of the etch residues to the coating of the workpiece structure are carried out such that a liquid constantly exists between the patterns of the workpiece structure, and wherein $N_{OH}/N_{CH}$ of the second chemical liquid is less than $N_{OH}/N_{CH}$ of the rinse liquid but is greater than $N_{OH}/N_{CH}$ of the coating liquid, where $N_{CH}$ represents a number of CH groups within a single molecule and $N_{OH}$ represents a number of OH groups within a single molecule.

12. The method according to claim 11, wherein the coating liquid comprises a polysilazane solution.

13. The method according to claim 12, further comprising supplying a third chemical liquid to the workpiece structure, after substituting the rinse liquid with the second chemical liquid and before the coating, and substituting the second chemical liquid remaining between the patterns with the third chemical liquid,
- wherein $N_{OH}/N_{CH}$ of the third chemical liquid is less than $N_{OH}/N_{CH}$ of the second chemical liquid but is equal to or greater than $N_{OH}/N_{CH}$ of the coating liquid.

14. The method according to claim 13, wherein the second chemical liquid comprises an isopropylalcohol.

15. The method according to claim 14, wherein the third chemical liquid comprises a dibutylether.

16. The method according to claim 15, wherein the polysilazane solution comprises a solvent including a dibutylether.

17. The method according to claim 11, further comprising supplying a solution including ozone or hydrogen peroxide, after the cleaning and before the rinsing, to oxidize a surface of the workpiece structure.

* * * * *